US012292848B2

(12) United States Patent
Nowak et al.

(10) Patent No.: US 12,292,848 B2
(45) Date of Patent: May 6, 2025

(54) BI-DIRECTIONAL BUS REPEATER

(71) Applicant: NEXPERIA B.V., Nijmegen (NL)

(72) Inventors: Katarzyna Nowak, Nijmegen (NL); Geethanadh Asam, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 145 days.

(21) Appl. No.: 17/953,649

(22) Filed: Sep. 27, 2022

(65) Prior Publication Data

US 2023/0097034 A1 Mar. 30, 2023

(30) Foreign Application Priority Data

Sep. 27, 2021 (EP) .................... 21199052

(51) Int. Cl.
  *G06F 13/42* (2006.01)
  *G06F 13/40* (2006.01)
  *H03K 3/037* (2006.01)
  *H03K 19/20* (2006.01)

(52) U.S. Cl.
  CPC ......... *G06F 13/4068* (2013.01); *H03K 3/037* (2013.01); *H03K 19/20* (2013.01)

(58) Field of Classification Search
  CPC .... G06F 13/4068; H03K 3/037; H03K 19/20; H03K 19/01759; H04L 25/0264
  See application file for complete search history.

(56) References Cited

U.S. PATENT DOCUMENTS

| 5,923,187 | A  | * | 7/1999  | Maugars ............... H04L 5/18 |
|           |    |   |         | 326/62 |
| 2014/0207984 | A1 | * | 7/2014 | Maung ................ G06F 13/385 |
|           |    |   |         | 710/105 |
| 2018/0323785 | A1 | * | 11/2018 | Suma Vinay ...... H03K 19/0008 |
| 2022/0385290 | A1 | * | 12/2022 | Nowak ............. H03K 19/0027 |
| 2023/0097034 | A1 | * | 3/2023  | Nowak ............ H03K 19/01759 |
|           |    |   |         | 710/105 |

OTHER PUBLICATIONS

Extended European Search Report for corresponding European application EP21199052.8 8 pages dated Mar. 29, 2022.

\* cited by examiner

*Primary Examiner* — Henry Tsai
*Assistant Examiner* — Kim T Huynh
(74) *Attorney, Agent, or Firm* — Ruggiero McAllister & McMahon LLC

(57) ABSTRACT

The present disclosure relates to a bi-directional bus repeater. The present disclosure further relates to a communication bus including a bi-directional bus repeater, and to a communication system including the communication bus. The bi-directional bus repeater includes a first input terminal, a second input terminal, a first pulldown element connected to the first input terminal, and a second pulldown element connected to the second input terminal. By ensuring that the activation of the first and second pulldown elements is dependent on the state of the corresponding input terminal and the detection of a high-to-low transition of the corresponding other input terminal, the problem of self-locking can be avoided or at least minimized.

18 Claims, 3 Drawing Sheets

BI-DIRECTIONAL BUS REPEATER

CROSS REFERENCE TO RELATED APPLICATION

This application claims the benefit under 35 U.S.C. § 119(a) of European Application No. 21199052.8 filed Sep. 27, 2021, the contents of which are incorporated by reference herein in their entirety.

BACKGROUND OF THE DISCLOSURE

1. Field of the Disclosure

The present disclosure relates to a bi-directional bus repeater. The present disclosure further relates to a communication bus comprising such bi-directional bus repeater, and to a communication system comprising such communication bus.

2. Description of the Related Art

FIG. 1 illustrates a known communication system 1 comprising a first communication unit 2 and a second communication unit 3 that are connected using a bi-directional Inter-Integrated Circuit, I²C, communication bus 4. Bi-directional communication bus 4 comprises a first segment 5 comprising a bus line 5A and a second segment 6 comprising a bus line 6A that are connected using a bi-directional bus repeater 10. It should be noted that typically first segment 5 and second segment 6 each comprise a plurality of bus lines.

First segment 5 further comprises a pull-up resistor 7 connected in between bus line 5A and a supply voltage Vcc, and second segment 6 a pull-up resistor 8 connected in between bus line 6A and supply voltage Vcc.

First segment 5 and second segment 6 each have a parasitic capacitance, which in FIG. 1 is denoted by C1 and C2, respectively.

First communication unit 2 comprises an I²C controller 21 that controls a pull-down transistor Q1 that is connected in between bus line 5A and ground. It further comprises a buffer 22 connected in between bus line 5A and an input of I²C controller 21.

Second communication unit 3 comprises an I²C controller 31 that controls a pull-down transistor Q2 that is connected in between bus line 6A and ground. It further comprises a buffer 32 connected in between bus line 6A and an input of I²C controller 31.

For each pair of bus lines 5A, 6A, bus repeater 10 comprises a repeater unit 10A. Each bus repeater unit 10A has a first input terminal 11 and a second input terminal 12. It further comprises a first inverting buffer 13 having its input connected to first input terminal 11 and its output connected to a controlling input of a pull-down transistor Q4, which transistor is arranged in between second input terminal 12 and ground. Repeater unit 10A further comprises a second inverting buffer 14 having its input connected to second input terminal 12 and its output connected to a controlling input of a pull-down transistor Q3, which transistor is arranged in between first input terminal 11 and ground. In repeater unit 10A, second inverting buffer 14 may thus form (part of) a first pulldown controller for controlling pull-down transistor Q4, and first inverting buffer 13 may form (part of) a second pulldown controller for controlling pull-down transistor Q3.

Bi-directional communication bus 4 has a high idle state. When first communication unit 2 transfers data over bus line 5A, the voltage at first input terminal 11 will change over time. When a high-to-low transition occurs on bus line 5A due to Q1 being activated by I²C controller 21, first inverting buffer 13 will activate pull-down transistor Q4 thereby causing a high-to-low transition on line bus 6A that reaches second communication unit 3. When Q1 becomes deactivated, pull-up resistor 7 will pull the voltage on bus line 5A up. Such a low-to-high transition will, through first inverting buffer 13, deactivate transistor Q4, which will allow the voltage on bus line 6A to be pulled up by pull-up resistor 8.

It should be noted that hereinafter, a statement referring to pulling up a voltage and a statement referring to pulling up a node at which this voltage is provided are assumed identical. Similar considerations apply for pulling down a voltage.

The operation of communication system 1 is bi-directional. More specifically, data communication is also possible from second communication unit 3 to first communication unit 2 in a manner similar to that described above.

The known system 1 suffers from a self-locking problem. For example, as a result of the abovementioned high-to-low transition occurring on bus line 5A, Q4 will be activated thereby pulling down bus line 6A. A logic low at bus line 6A will result, via second inverting buffer 14, in the activating of Q3. This will in turn pull down bus line 5A even more. This pull down will continue even after Q1 becomes deactivated. As such, system 1 is in a state in which both Q3 and Q4 are activated, thereby essentially locking communication bus 4 and the communication between first and second communication units 2, 3.

SUMMARY

It is an object of the present disclosure to provide a bi-directional bus repeater that prevents the abovementioned self-locking problem. It is a particular object of the present disclosure to provide a bi-directional bus repeater that prevents the abovementioned self-locking problem in case a high-to-low transition occurs, substantially simultaneously, at the first and second input terminals.

According to the present disclosure, this object is achieved using the bi-directional bus repeater as defined in claim 1 that is characterized in that the first pulldown controller comprises a first input connected to the first input terminal using a first connection and a second input connected to the second input terminal using a second connection, wherein the first pulldown controller is configured to provide the first control signal for activating the first pull-down element only after simultaneously detecting a high-to-low transition at its second input and a logical high at its first input. Furthermore, the second pulldown controller comprises a first input connected to the second input terminal using a first connection and a second input connected to the first input terminal using a second connection, wherein the second pulldown controller is configured to provide the second control signal for activating the second pulldown element only after simultaneously detecting a high-to-low transition at its second input and a logical high at its first input.

By ensuring that the activation of the first and second pulldown elements is dependent on the state of the corresponding input terminal and the detection of a high-to-low transition of the corresponding other input terminal, the problem of self-locking can be avoided or at least minimized.

A time delay preferably exists between a voltage at the first input of the first pulldown controller and a voltage at the second input of the second pulldown controller such that the second pulldown controller is prevented from providing the second control signal for activating the second pulldown element when the first pulldown element is active. Similarly, a time delay preferably exists between a voltage at the first input of the second pulldown controller and a voltage at the second input of the first pulldown controller such that the first pulldown controller is prevented from providing the first control signal for activating the first pulldown element when the second pulldown element is active. In this manner, by appropriately choosing the time delays, the self-locking problem can be avoided even in the case of high-to-low transitions occurring exactly at the same time on the first and second input terminals. For example, the first connection connecting the first input terminal to the first input of the first pulldown controller and the second connection connecting the first input terminal to the second input of the second pulldown controller may comprise a shared part extending between the first input terminal and a first node. Similarly, the first connection connecting the second input terminal to the first input of the second pulldown controller and the second connection connecting the second input terminal to the second input of the first pulldown controller may comprise a shared part extending between the second input terminal and a second node. Then, a time delay between the first node and the second input of the second pulldown controller is much larger than a fall-time associated with a high-to-low transition of a voltage at the second node occurring as a result of a high-to-low transition occurring at the second input terminal. Similarly, a time delay between the second node and the second input of the first pulldown controller is much larger than a fall-time associated with a high-to-low transition of a voltage at the first node occurring as a result of a high-to-low transition occurring at the first input terminal.

The first pulldown controller may comprise a third input connected to the second input terminal through a third connection, wherein the first pulldown controller is configured for deactivating the first pulldown element when detecting a logical high at its third input. Similarly, the second pulldown controller may comprise a third input connected to the first input terminal through a third connection, wherein the second pulldown controller is configured for deactivating the second pulldown element when detecting a logical high at its third input. For example, the first pulldown controller can be configured to perform said deactivating in response to detecting a logical high at its third input regardless the inputs received at its first input and its second input. Similarly, the second pulldown controller can be configured to perform said deactivating in response to detecting a logical high at its third input regardless the inputs received at its first input and its second input. This can for example be obtained when the third connection between the second input terminal and the third input of the first pulldown controller and the second connection between the second input terminal and the second input of the first pulldown controller comprise a shared part extending between a third node and the second input terminal, wherein a time delay between the third node and the second input of the first pulldown controller is such that a high level at the third node will deactivate the first pulldown element regardless the input at the second input or first input thereof. Similarly, the third connection between the first input terminal and the third input of the second pulldown controller and the second connection between the first input terminal and the second input of the second pulldown controller may comprise a shared part extending between a fourth node and the first input terminal, wherein a time delay between the fourth node and the second input of the second pulldown controller is such that a high level at the fourth node will deactivate the second pulldown element regardless the input at the second input or first input thereof.

The first pulldown controller may comprise a first flip-flop and the second pulldown controller may comprise a second flip-flop. For example, the first flip-flop and the second flip-flop may each comprise a negative edge triggered D flip-flop, the flip-flop having a data input corresponding to the first input, a clock input corresponding to the second input, a reset input corresponding to the third input, and a state output connected to the first pulldown element or the second pulldown element, respectively.

The first connection between the first input terminal and the first input of the first pulldown controller may comprise a first Schmitt trigger having a buffered output, and the first connection between the second input terminal and the first input of the second pulldown controller may comprise a second Schmitt trigger having a buffered output. This first Schmitt trigger having a buffered output may comprise a first series connection of a first Schmitt trigger and a first buffer, wherein an input of the first series connection is connected to the first input terminal and an output of the first series connection to the first input of the first pulldown controller and to the second input of the second pulldown controller, wherein, preferably, the first Schmitt trigger is an inverting Schmitt trigger and the first buffer is an inverter. Similarly, the second Schmitt trigger having a buffered output may comprise a second series connection of a second Schmitt trigger and a second buffer, wherein an input of the second series connection is connected to the second input terminal and an output of the second series connection to the first input of the second pulldown controller and to the second input of the first pulldown controller, wherein, preferably, the second Schmitt trigger is an inverting Schmitt trigger and the second buffer is an inverter.

The first Schmitt trigger having a buffered output can be arranged in between the first node and the first input terminal, and the second Schmitt trigger having a buffered output can be arranged in between the second node and the second input terminal.

The second connection between the first input terminal and the second input of the second pulldown controller may comprise a first level shifter, and the second connection between the second input terminal and the second input of the first pulldown controller may comprise a second level shifter. The first level shifter can be arranged in between the first node (N1) and the fourth node (N4), and the second level shifter can be arranged in between the second node (N2) and the third node (N2).

The first level shifter may comprise an input connected to the first input terminal, or when applicable, to the output of the first series connection. The first level shifter may additionally comprise an output connected to the second input of the second pulldown controller, and, and when applicable, to the third input of the second pulldown controller. The first level shifter may further comprise a first supply voltage terminal for receiving a first supply voltage and a second supply voltage terminal for receiving a second supply voltage different from the first supply voltage. The first pulldown controller, and, when applicable, the first Schmitt trigger and the first buffer, can be fed using this first supply voltage. The first level shifter can be configured to translate a voltage range of a voltage received at its input referenced to the first supply voltage to a voltage range of a voltage outputted at its output referenced to the second supply voltage. Similarly, the second level shifter may comprise an input connected to the second input terminal, or when applicable, to the output of the second series connection. The second level shifter may additionally comprise an output connected to the second input of the first pulldown controller, and, when applicable, to the third input of the first pulldown controller. The second level shifter may further comprise a first supply voltage terminal for receiving a first supply voltage and a second supply voltage terminal for receiving a second supply voltage different from the first supply voltage. The second pulldown controller, and when applicable, the second Schmitt trigger and the second buffer, can be fed using the second supply voltage. The second level shifter may be configured to translate a voltage range of a voltage received at its input referenced to the second supply voltage to a voltage range of a voltage outputted at its output referenced to the first supply voltage.

Each repeater unit may further comprise a first delay element having a buffered output arranged between the output of the second level shifter and the second input of the first pulldown controller, wherein the first delay element is preferably fed using the first supply voltage. Each repeater unit may further comprise a second delay element having a buffered output arranged between the output of the first level shifter and the second input of the second pulldown controller, wherein the fourth delay element is preferably fed using the second supply voltage.

The first pulldown element and the second pulldown element may each comprise a transistor, preferably a field-effect transistor, more preferably an n-channel metal-oxide-semiconductor field-effect transistor.

The bi-directional bus repeater can be configured to be placed in an open-drain communication bus that is preferably configured for implementing the Inter-Integrated Circuit, I²C, protocol. Additionally or alternatively, the bi-directional bus repeater may comprise a plurality of the abovementioned repeater units, wherein the plurality of repeater units is integrated on a same semiconductor die and/or housed in a same package.

According to a second aspect, the present disclosure provides a bi-directional communication bus that comprises a first segment comprising one or more bus lines, a second segment comprising one or more bus lines, wherein each bus line of the first segment forms a pair with a respective bus line of the second segment. The communication bus further comprises a bus repeater as described above comprising a respective repeater unit for each pair of bus lines.

The first input terminal of a given repeater unit is connected to a given bus line of the first segment, and wherein the second input terminal of that repeater unit is connected to the bus line of the second segment that forms a pair with said given bus line of the first segment. The bi-directional communication bus may further comprise, for each bus line of the first and second segments, a pullup element. Each pullup element can be a resistor connected in between a respective bus line and a supply voltage. The pullup elements can optionally be integrated in the repeater units.

The bi-directional communication bus can be an open-drain communication bus that is preferably configured for implementing the Inter-Integrated Circuit, I²C, protocol.

In so far as the communication bus comprises level shifters as described above, the supply voltage may equal the first supply voltage for the bus line(s) that are connected to the first input terminal(s) of the repeater unit(s), and the supply voltage may equal the second supply voltage for the bus line(s) that are connected to the second input terminal(s) of the repeater unit(s).

According to a third aspect, the present disclosure may provide a communication system that comprises a first communication unit, a second communication unit, and the bi-directional communication bus as described above for connecting the first communication unit and the second communication unit.

Each of the first communication unit and second communication unit can be configured to transmit data to the other communication unit by pulling down a voltage at a bus line of the first segment or second segment of the bi-directional communication bus it is connected to.

BRIEF DESCRIPTION OF THE DRAWINGS

Next, the present disclosure will be described in more detail referring to the appended drawings, wherein.

DETAILED DESCRIPTION

Figure 1:
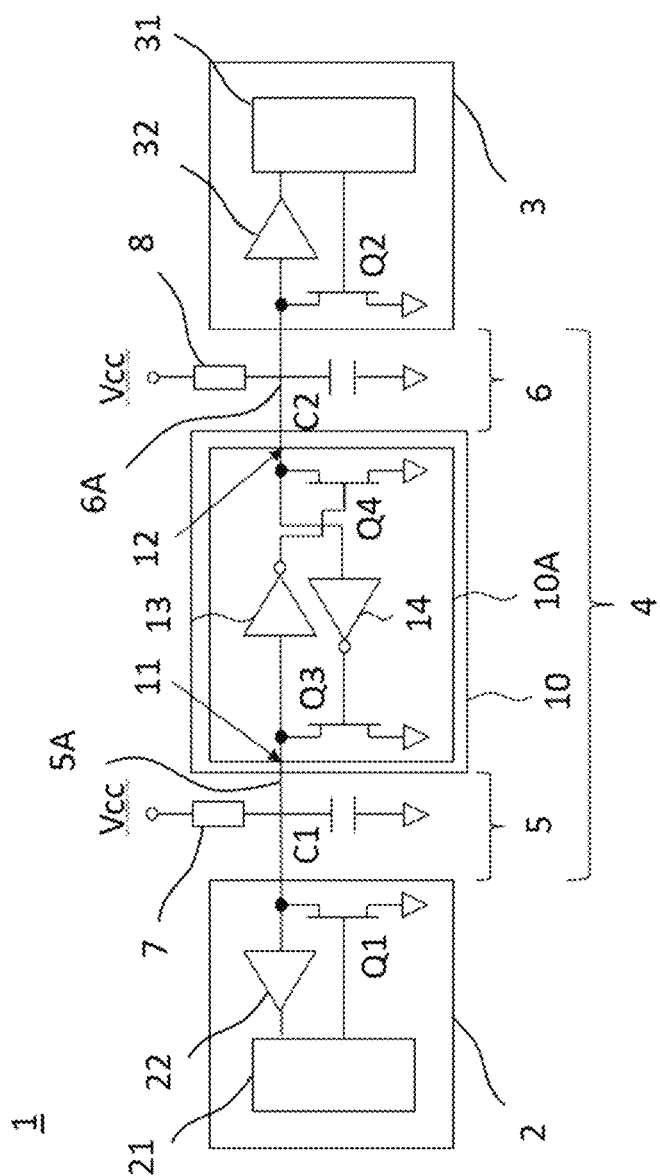
FIG. 1 illustrates a known communication system using a bi-directional repeater.
Figure 2:
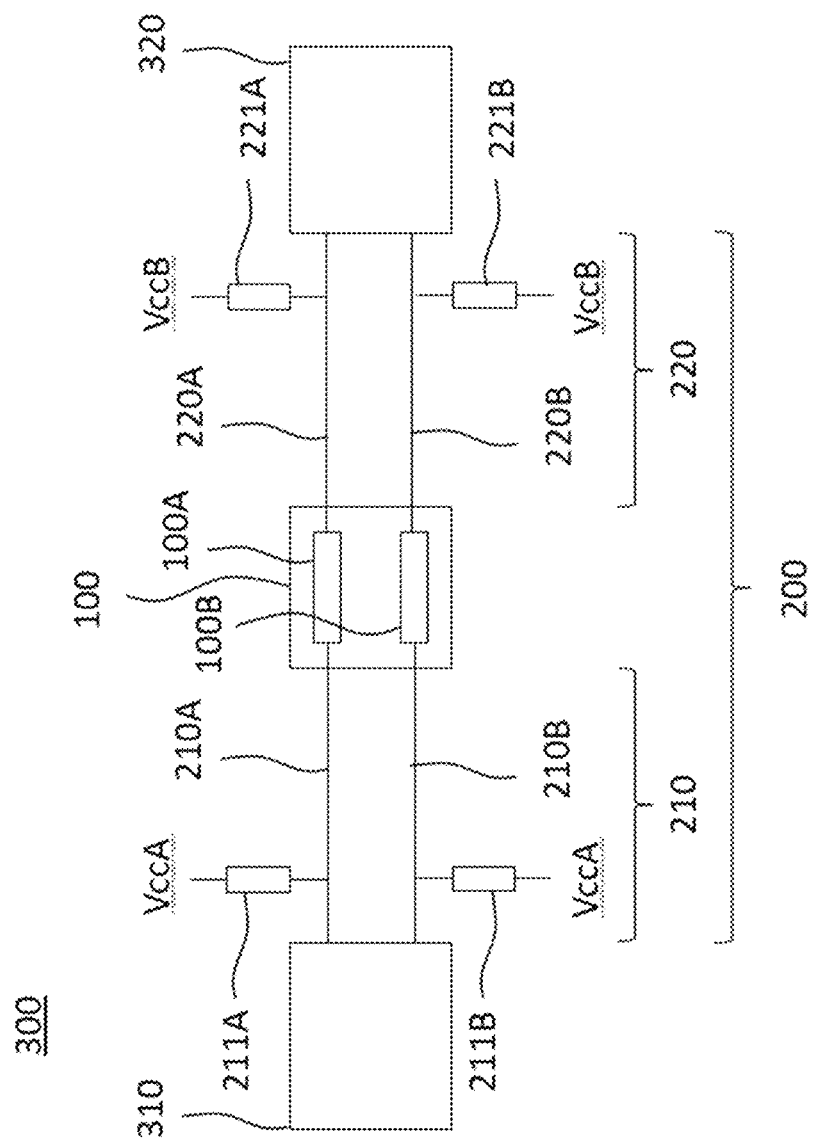
FIG. 2 illustrates an embodiment of a communication system in accordance with the present disclosure.

FIG. 2 illustrates an embodiment of a communication system 300 in accordance with the present disclosure. It comprises a first communication unit 310 that can be embodied as communication unit 2 in FIG. 1, a second communication unit 320 that can be embodied as communication unit 3 in FIG. 1, and a bi-directional communication bus 200. Communication between first communication unit 310 and second communication unit 320 can be based on the I²C protocol.

Bi-directional communication bus 200 comprises a first segment 210 comprising a data line 210A and a clock line 210B, and a second segment 220 comprising a data line 220A and a clock line 220B. Communication bus 200 further comprises a bi-directional bus repeater 100 that comprises repeater units 100A, 100B that connect data lines 210A, 220A and clock lines 210B, 220B, respectively. Pullup elements in the form of resistors 211A, 211B, 221A, 221B, are used for pulling up a voltage on lines 210A, 210B, 220A, 220B, respectively. Optionally, these pullup elements are incorporated in bi-directional bus repeater 100.

Figure 3:
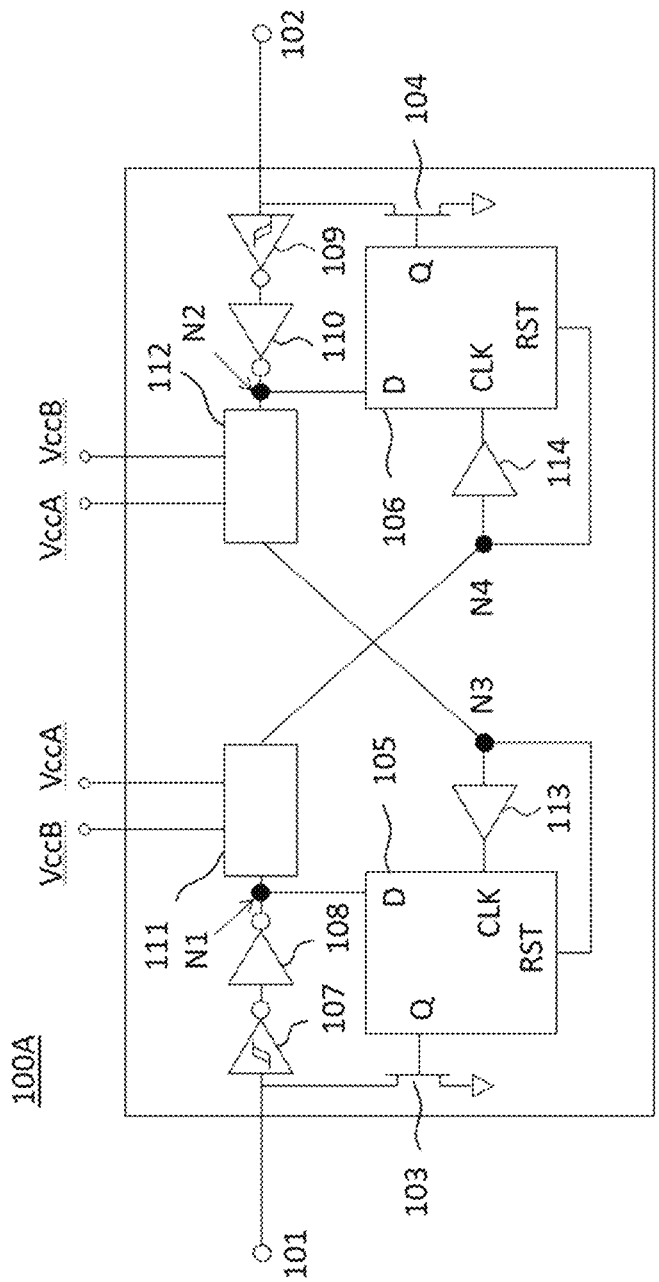
FIG. 3 illustrates an embodiment of a repeater unit in accordance with the present disclosure.

FIG. 3 illustrates repeater unit 100A in more detail. It comprises a first input terminal 101 and a second input terminal 102. An inverting Schmitt trigger 107 is arranged in series with an inverting buffer 108 in between first input terminal 101 and a node N1. Similarly, an inverting Schmitt trigger 109 is arranged in series with an inverting buffer 110 in between second input terminal 102 and a node N2.

Node N1 is connected to a data input D of a negative edge triggered flip-flop 105, and to an input of a level shifter 111. This latter level shifter changes a voltage range at its input, which is between ground and VccA, to a voltage range between ground and VccB for voltages at its output. As shown, the output of level shifter 111 is connected to a node N4.

Node N2 is connected to a data input D of negative edge triggered flip-flop 106, and to an input of a level shifter 112. This latter level shifter changes a voltage range at its input, which is between ground and VccB, to a voltage range between ground and VccA for voltages at its output. As shown, the output of level shifter 112 is connected to a node N3.

Node N3 is connected to a reset input RST of flip-flop 105 and, via a buffer or other time delay element 113, to clock input CLK of flip-flop 105. Similarly, node N4 is connected to a reset input RST of flip-flop 106 and, via a buffer or other time delay element 114, to clock input CLK of flip-flop 106.

A state output Q of flip-flop 105 is connected to a gate of an n-channel MOSFET 103. A drain of MOSFET 103 is connected to first input terminal 101, and a source of MOSFET 103 to ground. Similarly, a state output Q of flip-flop 106 is connected to a gate of an n-channel MOSFET 104, wherein a drain of MOSFET 104 is connected to second input terminal 102, and a source of MOSFET 104 to ground.

Inverting Schmitt trigger 107, inverting buffer 108, flip-flop 105, and time delay element 113 are all fed using supply voltage VccA, and inverting Schmitt trigger 109, inverting buffer 110, flip-flop 106, and time delay element 114 are all fed using supply voltage VccB.

Repeater unit 100A is bi-directional. More specifically, the operation of repeater unit 100A when handling communication from first input terminal 101 to second input terminal 102 is similar to handling communication from second input terminal 102 to first input terminal 101.

In an idle state, voltages at first input terminal 101 and second input terminal 102 will be at a logical high level. Consequently, the voltages at nodes N3 and N4, and at reset inputs RST of flip-flops 105, 106, will be at a logical high level as well. The state outputs Q of flip-flops 105, 106 will therefore be low thereby keeping MOSFETS 103, 104 in an isolating state.

If starting from this idle state, a high-to-low transition is applied to first input terminal 101 by communication unit 310, data input D of flip-flop 105 will change to a logical low level. Node N4 will also change to a logical low level. Due to the time delay associated with time delay element 114, flip-flop 106 will not be in a reset state when the negative edge is detected at its clock input CLK. Consequently, the voltage level at data input D of flip-flop 106, which is still at a logical high level, will be clocked into flip-flop 106 causing the state output Q of flip-flop 106 to change to a logical high level. This will bring MOSFET 104 in a conductive state and the voltage at second input terminal 102 will be pulled down.

Due to the difference between the time delay from node N1 to clock input CLK of flip-flop 106 and the time delay from node N1 to data input D of flip-flop 105, the pulldown of the voltage at second input terminal 102 by MOSFET 104 will occur later than node N1 reaching a logical low level. Consequently, the high-to-low transition occurring at second input terminal 102 due to the voltage pulldown by MOSFET 104 will not be able to switch state output Q of flip-flop 105 due to the fact that at the time of detecting such transition at clock input CLK of flip-flop 105, data input D of flip-flop 105 will already be at a logical low level. Furthermore, MOSFET 104 will keep pulling down the voltage at second input terminal 102 until the voltage at input terminal 101 reaches a logical high value. More in particular, at that time, the input at reset input RST of flip-flop 106 will regain a logical high level, thereby resetting flip-flop 106 such that the output at state output Q is at a logical low level and MOSFET 104 is put in the isolating state. Thereafter, pullup resistor 221A will pull up the voltage at second input terminal 102.

Next, the situation will be described in which a high-to-low transition occurs at first input terminal 101 and second input terminal 102 substantially simultaneously. In this case, the negative edge will appear at clock input CLK of flip-flop 106 substantially later than data input D of flip-flop 105 reaching a logical low level. Similarly, the negative edge associated with the voltage transition at second input terminal 102 will appear at clock input CLK of flip-flop 105 substantially later than data input D of flip-flop 106 reaching a logical low level. Consequently, flip-flops 105, 106 will both not change their state outputs Q thereby preventing the self-locking situation discussed in conjunction with FIG. 1.

Next, the situation will be described in which a high-to-low transition occurs at first input terminal 101 slightly later than a high-to-low transition at second input terminal 102. In this case, flip-flop 105 will not be in a reset state allowing the negative edge associated with the high-to-low transition at second input terminal 102 to be detectable. Depending on the temporal offset between the high-to-low transitions occurring at first input terminal 101 and second input terminal 102, a logical high value will or will not be clocked into flip-flop 105. Hence, depending on this temporal offset, the voltage at first input terminal 101 will or will not be pulled down by MOSFET 103.

However, despite the voltage at data input D of flip-flop 105 being at a logical high level at the time of flip-flop 105 detecting a high-to-low transition at its clock input CLK, which situation may occur for relatively large temporal offsets, the high-to-low transition at node N1 will not result in a state change of flip-flop 106 as data input D of flip-flop 106 is already at a logical low level due to a difference between the time delay from node N2 to clock input CLK of flip-flop 105 and the time delay from node N2 to data input D of flip-flop 106. Accordingly, in this case, MOSFET 103 will pulldown the voltage at first input terminal 101, whereas MOSFET 104 will be in the isolating state.

If the voltage at data input D is at a logical low value at the time of flip-flop 105 detecting a high-to-low transition, which situation may occur for relatively small temporal offsets, flip-flop 105 will not change its state. In this case, the high-to-low transition at node N1 will be detected at clock input CLK of flip-flop 106 after which the logical low value at node N2 will be clocked into flip-flop 106 thereby maintain MOSFET 104 in the isolating state.

To conclude, repeater unit 100A prevents a situation in which flip-flop 105 and flip-flop 106 simultaneously have a state output Q that is at a logical high level, thereby preventing the self-locking problem mentioned before.

In the above, the present disclosure has been explained using detailed embodiments thereof. However, various modifications are possible to these claims without departing from the scope of the present disclosure that is defined by the appended claims and their equivalents.

What is claimed is:

1. A bi-directional bus repeater comprising one or more repeater units, each repeater unit comprising:
   a first input terminal;
   a second input terminal;
   a first pulldown element for pulling down a voltage at the first terminal in response to a first control signal;
   a second pulldown element for pulling down a voltage at the second terminal in response to a second control signal;
   a first pulldown controller for providing the first control signal in dependence of a voltage at the second input terminal;
   a second pulldown controller for providing the second control signal in dependence of a voltage at the first input terminal;

wherein the first pulldown controller comprises a first input connected to the first input terminal using a first connection and a second input connected to the second input terminal using a second connection;

wherein the first pulldown controller is configured to provide the first control signal for activating the first pulldown element only after simultaneously detecting a high-to-low transition at its second input and a logical high at its first input;

wherein the second pulldown controller comprises a first input connected to the second input terminal using a first connection and a second input connected to the first input terminal using a second connection; and wherein the second pulldown controller is configured to provide the second control signal for activating the second pulldown element only after simultaneously detecting a high-to-low transition at its second input and a logical high at its first input.

2. The bi-directional bus repeater according to claim 1, further comprising a time delay existing between a voltage at the first input of the first pulldown controller and a voltage at the second input of the second pulldown controller so that the second pulldown controller is prevented from providing the second control signal for activating the second pulldown element when the first pulldown element is active; and a time delay existing between a voltage at the first input of the second pulldown controller and a voltage at the second input of the first pulldown controller so that the first pulldown controller is prevented from providing the first control signal for activating the first pulldown element when the second pulldown element is active.

3. The bi-directional bus repeater according to claim 1, wherein the bi-directional bus repeater is configured to be placed in an open-drain communication bus that is configured for implementing the Inter-Integrated Circuit, I²C, protocol.

4. The bi-directional bus repeater according to claim 1, wherein the first pulldown element and the second pulldown element each comprise a transistor; and/or wherein the bi-directional bus repeater comprises a plurality of the repeater units, wherein the plurality of repeater units is integrated on a same semiconductor die and/or housed in a same package.

5. The bi-directional bus repeater according to claim 1, wherein the first pulldown controller comprises a third input connected to the second input terminal through a third connection, the first pulldown controller being configured for deactivating the first pulldown element when detecting a logical high at its third input; and wherein the second pulldown controller comprises a third input connected to the first input terminal through a third connection, the second pulldown controller being configured for deactivating the second pulldown element when detecting a logical high at its third input.

6. The bi-directional bus repeater according to claim 1, wherein the first pulldown controller comprises a first flip-flop and the second pulldown controller comprises a second flip-flop; and wherein the first flip-flop and the second flip-flop each comprise a negative edge triggered D flip-flop, the flip-flop having a data input corresponding to the first input, a clock input corresponding to the second input, a reset input corresponding to the third input, and a state output connected to the first pulldown element or the second pulldown element, respectively.

7. The bi-directional bus repeater according to claim 2, wherein the first connection connecting the first input terminal to the first input of the first pulldown controller and the second connection connecting the first input terminal to the second input of the second pulldown controller comprise a shared part extending between the first input terminal and a first node;

wherein the first connection connecting the second input terminal to the first input of the second pulldown controller and the second connection connecting the second input terminal to the second input of the first pulldown controller comprise a shared part extending between the second input terminal and a second node; and a time delay between the first node and the second input of the second pulldown controller is much larger than a fall-time associated with a high-to-low transition of a voltage at the second node occurring as a result of a high-to-low transition occurring at the second input terminal, and a time delay between the second node and the second input of the first pulldown controller is much larger than a fall-time associated with a high-to-low transition of a voltage at the first node occurring as a result of a high-to-low transition occurring at the first input terminal.

8. The bi-directional bus repeater according to claim 4, wherein the transistor is a field-effect transistor.

9. The bi-directional bus repeater according to claim 4, wherein the transistor is an n-channel metal-oxide-semiconductor field-effect transistor.

10. The bi-directional bus repeater according to claim 5, wherein the first pulldown controller is configured to perform the deactivating in response to detecting a logical high at its third input regardless the inputs received at its first input and its second input;

wherein the second pulldown controller is configured to perform the deactivating in response to detecting a logical high at its third input regardless the inputs received at its first input and its second input;

wherein the third connection between the second input terminal and the third input of the first pulldown controller and the second connection between the second input terminal and the second input of the first pulldown controller comprise a shared part extending between a third node and the second input terminal;

a time delay between the third node and the second input of the first pulldown controller is such that a high level at the third node will deactivate the first pulldown element regardless the input at the second input or first input thereof;

wherein the third connection between the first input terminal and the third input of the second pulldown controller and the second connection between the first input terminal and the second input of the second pulldown controller comprise a shared part extending between a fourth node and the first input terminal; and a time delay between the fourth node and the second input of the second pulldown controller is such that a high level at the fourth node will deactivate the second pulldown element regardless the input at the second input or first input thereof.

11. The bi-directional bus repeater according to claim 5, wherein the second connection between the first input terminal and the second input of the second pulldown controller comprises a first level shifter, and wherein the second connection between the second input terminal and the second input of the first pulldown controller comprises a second level shifter.

12. The bi-directional bus repeater according to claim 7, wherein the first connection between the first input terminal and the first input of the first pulldown controller comprises a first Schmitt trigger having a buffered output;
- wherein the first connection between the second input terminal and the first input of the second pulldown controller comprises a second Schmitt trigger having a buffered output;
- wherein the first Schmitt trigger having a buffered output comprises a first series connection of a first Schmitt trigger and a first buffer;
- an input of the first series connection is connected to the first input terminal and an output of the first series connection to the first input of the first pulldown controller and to the second input of the second pulldown controller;
- wherein, the first Schmitt trigger is an inverting Schmitt trigger and the first buffer is an inverter;
- wherein the second Schmitt trigger having a buffered output comprises a second series connection of a second Schmitt trigger and a second buffer;
- an input of the second series connection is connected to the second input terminal and an output of the second series connection to the first input of the second pulldown controller and to the second input of the first pulldown controller;
- wherein the second Schmitt trigger is an inverting Schmitt trigger and the second buffer is an inverter; and
- wherein the first Schmitt trigger having a buffered output is arranged in between the first node and the first input terminal, and the second Schmitt trigger having a buffered output is arranged in between the second node and the second input terminal.

13. The bi-directional bus repeater according to claim 11, wherein the first level shifter comprises:
- an input connected to the first input terminal, or to the output of the first series connection; and
- an output connected to the second input of the second pulldown controller and to the third input of the second pulldown controller;
- wherein the first level shifter further comprises a first supply voltage terminal for receiving a first supply voltage and a second supply voltage terminal for receiving a second supply voltage different from the first supply voltage;
- wherein the first pulldown controller and the first Schmitt trigger and the first buffer are fed using the first supply voltage; and
- wherein the first level shifter is configured to translate a voltage range of a voltage received at its input referenced to the first supply voltage to a voltage range of a voltage outputted at its output referenced to the second supply voltage.

14. The bi-directional bus repeater according to claim 11, wherein the second level shifter comprises:
- an input connected to the second input terminal, or via the output of the second series connection; and
- an output connected to the second input of the first pulldown controller, and to the third input of the first pulldown controller;
- wherein the second level shifter further comprises a first supply voltage terminal for receiving a first supply voltage and a second supply voltage terminal for receiving a second supply voltage different from the first supply voltage;
- wherein the second pulldown controller and the second Schmitt trigger and the second buffer are fed using the second supply voltage; and
- wherein the second level shifter is configured to translate a voltage range of a voltage received at its input referenced to the second supply voltage to a voltage range of a voltage outputted at its output referenced to the first supply voltage.

15. The bi-directional bus repeater according to claim 13, each repeater unit further comprising:
- a first delay element having a buffered output arranged between the output of the second level shifter and the second input of the first pulldown controller, wherein the first delay element is fed using the first supply voltage; and
- a second delay element having a buffered output arranged between the output of the first level shifter and the second input of the second pulldown controller, wherein the second delay element is fed using the second supply voltage.

16. The bi-directional bus repeater according to claim 14, each repeater unit further comprising:
- a first delay element having a buffered output arranged between the output of the second level shifter and the second input of the first pulldown controller, wherein the first delay element is fed using the first supply voltage; and
- a second delay element having a buffered output arranged between the output of the first level shifter and the second input of the second pulldown controller, wherein the second delay element is fed using the second supply voltage.

17. A bi-directional communication bus, comprising:
- a first segment comprising one or more bus lines;
- a second segment comprising one or more bus lines;
- wherein each bus line of the first segment forms a pair with a respective bus line of the second segment;
- a bus repeater as defined in claim 1 comprising a respective repeater unit for each pair of bus lines;
- wherein the first input terminal of a given repeater unit is connected to a given bus line of the first segment;
- wherein the second input terminal of that repeater unit is connected to the bus line of the second segment that forms a pair with the given bus line of the first segment;
- wherein the bi-directional communication bus further comprises, for each bus line of the first and second segments, a pullup element;
- wherein the pullup element is a resistor connected in between a respective bus line and a supply voltage; and
- wherein the bi-directional communication bus is an open-drain communication bus that is configured for implementing the Inter-Integrated Circuit, I²C, protocol.

18. A communication system, comprising a:
- a first communication unit;
- a second communication unit;
- the bi-directional communication bus as defined in claim 17 for connecting the first communication unit and the second communication unit; and
- wherein each of the first communication unit and second communication unit is configured to transmit data to the other communication unit by pulling down a voltage at a bus line of the first segment or second segment of the bi-directional communication bus it is connected to.

* * * * *